United States Patent
Kato et al.

(10) Patent No.: US 6,272,984 B1
(45) Date of Patent: Aug. 14, 2001

(54) SQUEEGEE FOR SCREEN PRINTING AND SCREEN PRINTING METHOD

(75) Inventors: Seizi Kato, Toyota; Hiroshi Tsuta, Chiryu, both of (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/414,418

(22) Filed: Oct. 8, 1999

(30) Foreign Application Priority Data

Dec. 2, 1998 (JP) .................................................. 10-343235

(51) Int. Cl.⁷ ...................................................... B41M 1/12
(52) U.S. Cl. ........................ 101/129; 101/114; 101/123; 101/127; 101/169
(58) Field of Search ..................................... 101/114, 123, 101/127.1, 128.1, 129, 157, 169, 127; 118/105; 15/245, 236.02

(56) References Cited

U.S. PATENT DOCUMENTS

| | | |
|---|---|---|
| 3,930,445 | 1/1976 | Jaffa . |
| 5,681,387 * | 10/1997 | Schmidt ............................ 118/105 |
| 5,704,286 | 1/1998 | Takashima . |
| 5,713,276 | 2/1998 | Teoh et al. . |
| 5,819,651 * | 10/1998 | Zepic ............................... 101/127.1 |
| 6,047,636 * | 4/2000 | Newman ............................ 101/129 |

FOREIGN PATENT DOCUMENTS

| | | |
|---|---|---|
| 822 540 | 10/1951 | (DE) . |
| 40 15 292 A1 | 11/1991 | (DE) . |
| 0 787 585 A1 | 8/1997 | (EP) . |

* cited by examiner

Primary Examiner—Eugene Eickholt
(74) Attorney, Agent, or Firm—Oliff & Berridge, PLC

(57) ABSTRACT

A squeegee for use in screen printing, including a flexible portion, and one separation or two separations extending from a contact edge of the flexible portion for contact with a screen, toward a base portion of the squeegee, thereby at least partly separating the flexible portion, so that the flexible portion includes a first portion between the one separation and a lateral edge of the flexible portion, or between the two separations, and a second portion different from the first portion, and so that the first portion and the second portion are flexible independent of each other.

10 Claims, 13 Drawing Sheets

SQUEEGEE FOR SCREEN PRINTING AND SCREEN PRINTING METHOD

BACKGROUND OF THE INVENTION

1. Field of the Invention

The present invention relates to a squeegee for use in screen printing, and a screen printing method, and in particular to the art of performing screen printing on a surface of an object that has at least one projection.

2. Related Art Statement

Screen printing is performed using a screen and a squeegee. A screen having a plurality of print holes is placed on an object such as a printed circuit board, a print material such as a creamed solder or an adhesive is placed on the screen, and a squeegee is moved relative to the screen placed on the object, so that the print material is forced through the print holes of the screen onto one or more print spots on a print surface of the object. In the case where the print surface of the object has one or more projections, the screen may be one which has one or more embossed portions capable of accommodating the one or more projections, respectively, and accordingly does not interfere therewith. In the case where the object is a printed circuit board, the one or more projections of the object may be one or more electric components mounted on the circuit board, or one or more projections needed for easier production of the circuit board. In the case where the object has one or more projections and the screen has one or more embossed portions for accommodating the one or more projections, one or more portions of the squeegee that correspond to the one or more embossed portions of the screen climb over the one or more embossed portions, while the remaining portion or portions of the squeegee continue to contact the screen so as to force the print material through the print holes of the screen onto the object. Thus, the print material is printed on the object.

However, when a climb-over portion of the squeegee climbs over an embossed portion of the screen, a space is created between the screen and each of two adjacent portions of the squeegee on both sides of the climb-over portion of the same. More specifically described, when the climb-over portion of the squeegee climbs over the embossed portion of the screen, distant portions of the squeegee that are sufficiently distant from the climb-over portion in a direction perpendicular to the direction in which the squeegee is moved relative to the screen, and parallel to the plane of the screen, can continue to contact an embossment-free portion of the screen that is free of embossment, but the two adjacent portions of the squeegee that are near to the climb-over portion are separated from the screen by being pulled by the climb-over portion climbing over the embossed portion of the screen. Thus, on both lateral sides of the embossed portion of the screen, respective spaces are created whose dimensions increase in respective directions toward the embossed portion. Therefore, if there is a print spot on a lateral side of, and in vicinity of, a projection of the object to be printed, the print material may not be printed on the print spot of the object.

SUMMARY OF THE INVENTION

The present invention provides a squeegee for use in screen printing and a screen printing method that have one or more of the technical features that are described below in respective paragraphs given parenthesized sequential numbers (1) to (11). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the combinations thereof are just examples to which the present invention is by no means limited.

(1) According to a first feature of the present invention, there is provided a squeegee for use in screen printing, comprising a flexible portion; and one separation or two separations extending from a contact edge of the flexible portion for contact with a screen, toward a base portion of the squeegee, thereby at least partly separating the flexible portion, so that the flexible portion includes a first portion between the one separation and a lateral edge of the flexible portion, or between the two separations, and a second portion different from the first portion, and so that the first portion and the second portion are flexible independent of each other. The one separation or each of the two separations may, or may not, extend in a direction perpendicular to the contact edge of the flexible portion that extends in a direction parallel to the plane of the screen. In the case where the flexible portion has just one separation, the one separation may be so inclined that the distance between the one separation and one lateral edge of the flexible portion increases or decreases in a direction from the contact edge toward the base portion of the squeegee. In the case where the flexible portion has two or more separations, a pair of separations out of those separations may be so inclined that the distance between the pair of separations increases or decreases in the same direction. When at least one of the squeegee and the screen is moved relative to the other for printing the print material on an object, both the first and second portions of the flexible portion are moved on the screen, as a unit, i.e., without being separated from each other, over a portion of the screen that is free of embossment in the widthwise direction of the screen that is parallel to the direction in which the squeegee extends. Thus, the print material is forced through the print hole or holes of the screen onto the object. When the squeegee reaches an embossed portion of the screen, the first portion of the flexible portion that corresponds to the embossed portion is flexed by the embossed portion, independent of the second portion, so that only the first portion climbs over the embossed portion. Since the second portion is at least partly isolated from the first portion by the one or two separations, the second portion is not flexed with the first portion but remains in contact with a portion of the screen that is free of embossment. The one or two separations at least partly separates the flexible portion into the first and second portions. The present squeegee is free from the conventionally experienced problem that when a squeegee climbs over an embossed portion of a screen, two spaces are created, between the squeegee and the screen, on both lateral sides of the embossed portion in the widthwise direction of the screen, in such a way that respective dimensions of the two spaces increase in respective directions toward the embossed portion. That is, even if the screen may have a print hole in the vicinity of the embossed portion, the second portion of the flexible portion can force the print material into the print hole of the screen and thereby apply the print material to the object. Generally, the flexible portion is formed of a soft material such as rubber or the like. However, the flexible portion may be formed of a hard material such as hard synthetic resin or metal, if the flexible portion is so formed as to have such a thickness which assures that the flexible portion is flexed with such a force which does not damage the screen.

(2) According to a second feature of the present invention that includes the first feature (1), the one separation or each of the two separations has a length not smaller than one second of a dimension of the flexible portion in a direction in which the one separation or the each of the two separations extends. It is common that the base portion of the squeegee is held by a squeegee holder in such a way that the base portion cannot be flexed, e.g., cannot be elastically deformed. In this case, only a projecting portion of the squeegee that projects from the squeegee holder provides the flexible portion. The one separation or each of the two separations may have a length greater or shorter than the dimension of the flexible portion. Meanwhile, the base portion of the squeegee may be fixed with an adhesive to the squeegee holder. In the latter case, the entirety of the squeegee provides the flexible portion. The one separation or each of the two separations may have a length not greater than the dimension of the flexible portion and not shorter than one second of that dimension. The dimension of the flexible portion is so predetermined, while the material and thickness of the flexible portion are taken into account, as to be able to force accurately an appropriate amount of print material into each print hole of the screen. The longer the one separation or each of the two separations is, the more easily the first portion of the flexible portion can climb over the embossed portion of the screen and the longer durability the first portion can enjoy, but the longer time the first portion needs to return, after climbing over the embossed portion, to its initial shape or position in which it can force the print material into the print holes of the screen, and the lower degree of flushness the first portion suffers with respect to the second portion, in their original shapes or positions. On the other hand, the shorter the one separation or each of the two separations is, the lower degree of flexibility the first portion suffers, so that when the first portion is flexed, the second portion may also be flexed with the first portion. In the last case, the present squeegee cannot satisfactorily enjoy the advantages to be obtained by having one or more separations in the flexible portion. Therefore, the length of the one separation or each of the two separations should be determined by taking into account the dimension of the embossed portion and the distribution of print holes in the vicinity of the embossed portion. Generally, it is preferred that the length of the one separation or each of the two separations is not smaller than one second of the dimension of the flexible portion, more preferably, two thirds of the dimension, most preferably, three fourths of the dimension.

(3) According to a third feature of the present invention that includes the second feature (2), the one separation or the each of the two separations has a length not smaller than the dimension of the flexible portion in the direction in which the one separation or the each of the two separations extends. In the case where the base portion of the squeegee is held by a squeegee holder such that the base portion cannot be flexed, the one separation or each of the two separations may have a length equal to, or greater than, the dimension of a projecting portion of the squeegee that projects from the squeegee holder and provides the flexible portion. Meanwhile, in the case where the base portion of the squeegee is fixed with an adhesive to the squeegee holder, the one separation or each of the two separations may have a length equal to the dimension of the entirety of the squeegee that provides the flexible portion.

(4) According to a fourth feature of the present invention that includes the third feature (3), the flexible portion comprises two or three separate members which are separate from each other and which are arranged adjacent to each other such that a gap between the two separate members provides the one separation or two gaps among the three separate members provide the two separations, respectively. In the present squeegee, at least one of the two or three separate members provides the first portion which is flexible independent of the second portion provided by another or other separate members, that is, provides a climb-over portion which climbs over an embossed portion of the screen.

(5) According to a fifth feature of the present invention that includes the fourth feature (4), the squeegee further comprises a holding member which holds respective base portions of the two or three separate members. The present squeegee comprises the two or three separate members and the holding member. At least one of the two or three separate members provides the first portion which is flexible independent of the second portion provided by another or other separate members, that is, provides a climb-over portion which climbs over an embossed portion of the screen. Without employing the holding member, the two or three separate members may be held directly by a squeegee holder such that the separate members are arranged adjacent to each other in an array. In this case, the squeegee is provided by the separate members all of which are directly held by the squeegee holder. In contrast, according to the fifth feature (5), the squeegee can be handled as a unit in which the separate members are held by the holding member. Therefore, the squeegee can be easily attached to, and detached from, the squeegee holder, and the position of the squeegee attached to the squeegee holder, as viewed in the widthwise direction of the screen, can be easily changed or adjusted.

(6) According to a sixth feature of the present invention that includes any one of the first to fifth features (1) to (5), the one separation or each of the two separations has a width of 0.05 mm to 0.4 mm. The one separation or each of the two separations may not have a substantial width. In this case, however, when the first portion is flexed to climb over an embossed portion of the screen, the second portion may be flexed with the first portion because of friction produced therebetween, so that the squeegee may not enjoy the advantages to be obtained by having the one or more separations. In view of this, it is preferred that the one separation or each of the two separations has a width of not smaller than 0.05 mm, more preferably not smaller than 0.1 mm, most preferably not smaller than 0.2 mm. On the other hand, if the width of the one separation or each of the two separations is excessively great, the print material may leak through the one or each separation to the rear side of the squeegee, so that the surface of the screen may be stained with the print material, or an inappropriate amount of print material may be put in a print hole over which the one or each separation passes. In view of this, it is preferred that the one separation or each of the two separations has a width of not greater than 0.4 mm, more preferably not greater than 0.3 mm, most preferably not greater than 0.2 mm.

(7) According to a seventh feature of the present invention that includes any one of the first to sixth features (1) to (6), the squeegee has at least three separations each of which extends from the contact edge of the flexible portion toward the base portion of the squeegee, and which are provided at a regular interval of distance over a substantially entire length of the flexible portion in a direction parallel to the contact edge thereof. The present squeegee may be widely used for carrying out printing on a plurality of sorts of objects. That is, the present squeegee may not be an exclusively-used squeegee that is exclusively used for carrying out printing on a specific sort of object. The three or more separations of the present squeegee are not provided corresponding to one or more specific projections of an object (or one or more specific embossed portions of a screen), but are provided uniformly over the entire length of the flexible portion that possibly climbs over at least one projection or at least one embossed portion. Therefore, the present squeegee can be used for carrying out printing on any object, wherever the object may have at least one projection. However, it is preferred that the regular interval of distance (i.e., pitch) at which the separations are provided is selected based on the size of one or more projections present on the object. It is possible to prepare a plurality of sorts of squeegees having their separations at different pitches and to select and use an appropriate one of the squeegees based on the sort of an object (e.g., the size of one or more projections present on the object). It is preferred that a portion of an object that has no projection is printed using a squeegee having no or less separations. Therefore, in the case where objects to be printed have one or more great projections, it is preferred that the squeegee is provided with less separations corresponding to the size of the projections. In the present squeegee, the flexible portion is at least partly separated by the separations into independent flexible portions whose number is greater by one than that of the separations. In the case where one or more, but not all, of the independent flexible portions of the squeegee climb over one or more embossed portions of a screen, only the one or more flexible portions provide one or more climb-over portions and the remaining independent flexible portion or portions of the squeegee provide one or more non-climb-over portions. It is preferred that each one independent flexible portion of the squeegee climbs over one embossed portion of a screen. However, this is not essentially required. It is possible that two or more independent flexible portions adjacent to each other may simultaneously flex to climb over one embossed portion. For example, in the case where the present squeegee is used for carrying out printing on two sorts of objects having different sizes of projections, the squeegee may have separations at a pitch corresponding to the smaller size of projections. In this case, two or more independent flexible portions of the squeegee may simultaneously climb over each of the greater size of projections. On the contrary, it is possible that each one independent flexible portion of the squeegee simultaneously climbs over a plurality of embossed portions of a screen. In addition, a widely-used squeegee according to the seventh feature (7) may be held by a squeegee holding device such that the position where the squeegee is held is adjustable in the widthwise direction of the screen according to the position or positions where the screen has the one or more embossed portions. Alternatively, the squeegee holding device may include a position adjusting device for adjusting the position where the squeegee is held, in the widthwise direction of the screen. For example, in the case where the screen has only one embossed portion, the position adjusting device can be operated so that one independent flexible portion of the squeegee is accurately aligned with the one embossed portion. In the case where the screen has a plurality of embossed portions, the position adjusting device can be operated so that a plurality of independent flexible portions of the squeegee are accurately aligned with the embossed portions, respectively. Thus, the widely used squeegee can be used for carrying out printing on more sorts of objects. A position adjusting device may be employed in an exclusively-used squeegee, for the purpose of adjusting the position or positions of one or more separations of the squeegee, relative to the position or positions of one or more embossed portions of a specific sort of screen. Alternatively, it is possible that the position where an exclusively-used squeegee is held by a squeegee holding device is adjustable in a widthwise direction of a screen. Whether the squeegee according to the seventh feature (7) may be a widely-used squeegee or an exclusively-used squeegee, a position adjusting device may be employed therein for adjusting the position of the squeegee in the widthwise direction of the screen, so that each of the separations is positioned on a lateral side of a corresponding embossed portion of the screen, so that when one or more climb-over portions of the squeegee climb over one or more embossed portions of the screen, one or more non-climb-over portions of the squeegee do not interfere with any embossed portions, and so that the separations of the squeegee are not aligned with the print spots on the print surface of the object.

(8) According to an eighth feature of the present invention that includes any one of the first to sixth features (1) to (6), the two separations are inclined relative to a plane perpendicular to opposite surfaces of the flexible portion having a predetermined uniform thickness, such that a distance between the two inclined separations increases in a direction from a front one of the opposite surfaces toward the other, rear surface. The front surface of the flexible portion is defined as a downstream-side one of the opposite surfaces thereof as viewed in a print direction in which the squeegee is moved relative to the screen, and the rear surface thereof is defined as an upstream-side one of the opposite surfaces as viewed in the print direction. When the squeegee reaches one embossed portion of the screen, the first portion between the two inclined separations is flexed, independent of the second portion, to climb over the one embossed portion. Since the two separations are inclined, the first portion is smoothly separated from the second portion, without causing friction between two opposed surfaces that cooperate with each other to define one of the two inclined separations and between two opposed surfaces that cooperate with each other to define the other inclined separation. That is, when one climb-over portion of the squeegee is flexed, the one climb-over portion does not pull one or two adjacent non-climb-over portions because of friction otherwise produced. Therefore, when the one or more climb-over portions of the squeegee climb over the one or more embossed portions of the screen, the one or more non-climb-over portions of the squeegee are stably kept in contact with the screen.

(9) According to a ninth feature of the present invention that includes the eighth feature (8), an absolute value of an angle of inclination of each of the two separations relative to the plane falls in a range of from 10 degrees to 45 degrees. If the angle of inclination of each separation is too small, the squeegee cannot enjoy so much the advantage to be obtained by having the inclined separations. On the other hand, if the angle is too great, the cross-sectional shape of each of respective portions of the squeegee that are present on both sides of each inclined separation is too acute, and accordingly too flexible, so that the squeegee cannot stably or reliably apply the print material to the object. Therefore, it is preferred that the angle is not smaller than 10 degrees, more preferably not smaller than 15 degrees, most preferably not smaller than 20 degrees, and is not greater than 45 degrees, more preferably not greater than 40 degrees, most preferably not greater than 35 degrees.

(10) According to a tenth feature of the present invention, there is provided a method of printing a print material on a printed circuit board, by placing a screen having a plurality of print holes, on the circuit board, placing the print material on the screen, and moving at least one of a squeegee and the screen placed on the circuit board, relative to the other of the squeegee and the screen, in a first direction parallel to a plane of the screen, thereby forcing the print material through the print holes of the screen onto a plurality of print spots on a print surface of the circuit board, the circuit board having, on the print surface thereof, at least one projection, and at least one print spot in a vicinity of the at least one projection in a second direction substantially perpendicular to the first direction, the method comprising the steps of providing the screen having at least one embossed portion capable of accommodating the at least one projection, and at least one print hole in a vicinity of the at least one embossed portion in the second direction, providing the squeegee having, between one separation thereof and a lateral edge thereof, or between two separations thereof, at least one climb-over portion corresponding to the at least one embossed portion of the screen, the one separation or the two separations extending from a contact edge of the squeegee for contact with the screen, toward a base portion of the squeegee, thereby at least partly separating the squeegee, and forcing, with a portion of the squeegee different from the climb-over portion thereof, the print material through the print hole in the vicinity of the embossed portion of the screen onto the print spot in the vicinity of the projection on the print surface of the circuit board, while the climb-over portion of the squeegee climbs over the embossed portion of the screen. The present screen printing method enjoys the same advantages as those of the screen-print squeegee according to the first feature (1).

According to a tenth feature of the present invention that includes the tenth feature (10), the step of providing the squeegee comprises providing the squeegee having the one separation, or each of the two separations, at a distance of 0.5 mm to 4 mm from a corresponding one of opposite ends of the embossed portion of the screen in the second direction. If the distance between the one separation, or each of the two separations, and a corresponding one of the opposite ends of the embossed portion of the screen in the second direction is too small, a non-climb-over portion of the squeegee that is different from the climb-over portion thereof may interfere with the embossed portion of the screen. On the other hand, if the distance is too great, the non-climb-over portion of the squeegee may be too narrow in the second direction, so that the squeegee may not force the print material into one or more print holes of the screen and accordingly may not print the material on one or more print spots on the object. Thus, it is preferred that the above distance is not smaller than 0.5 mm, more preferably not smaller than 1 mm and is not greater than 4 mm, more preferably not greater than 3 mm, most preferably not greater than 2 mm.

It is noted that the screen-printing method according to the tenth or eleventh feature (10) or (11) may employ one or more of the first to ninth features (1) to (9) of the screen-print squeegee.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Referring first to FIGS. 1 to 7, there will be described a screen printing machine including a squeegee 10 to which the present invention is applied. The screen printing machine carries out a screen printing method to which the present invention is also applied.

Figure 2:
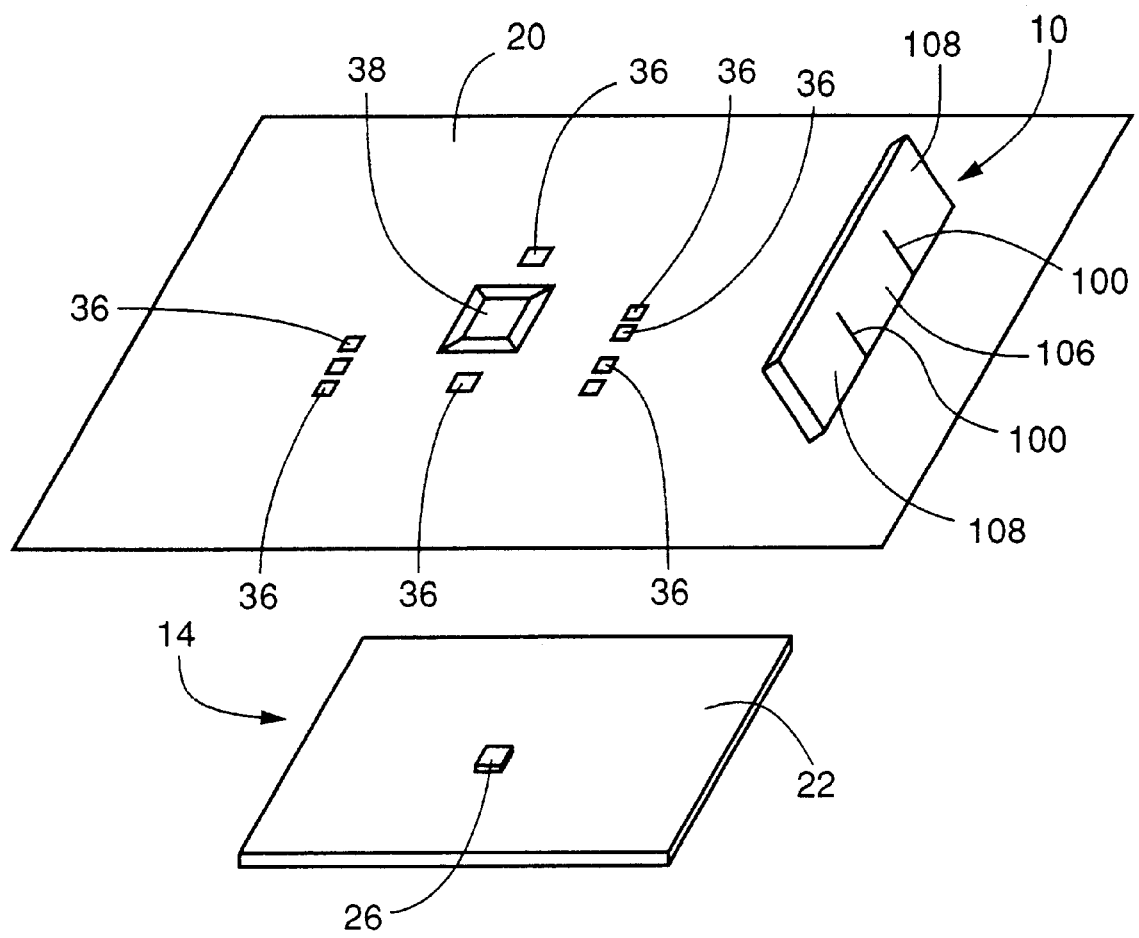
FIG. 2 is a perspective view of a screen of the screen printing machine of FIG. 1, and a printed circuit board on which creamed solder is printed by the printing machine through the screen.

A board conveying device (not shown) conveys, to the screen printing machine, a printed circuit board 14 as an object on which a print material is to be printed by the printing machine. The circuit board 14 is positioned and supported by a board positioning and supporting device 16, and is elevated and lowered by a board elevating and lowering device 18, so that the circuit board 14 is contacted with, and separated from, a screen 20. Thus, the board elevating and lowering device 18 provides a board contacting and separating device which moves the circuit board 14 relative to the screen 20 so that the board 14 is contacted with, and separated from, the screen 20. The circuit board 14 has a print surface 22 on which a creamed solder as the print material is to be printed by the printing machine. As shown in FIG. 2, the circuit board 14 has, on the print surface 22, an electric component 26 mounted thereon. The electric component 26 provides a projection present on the print surface 22.

Figure 1:
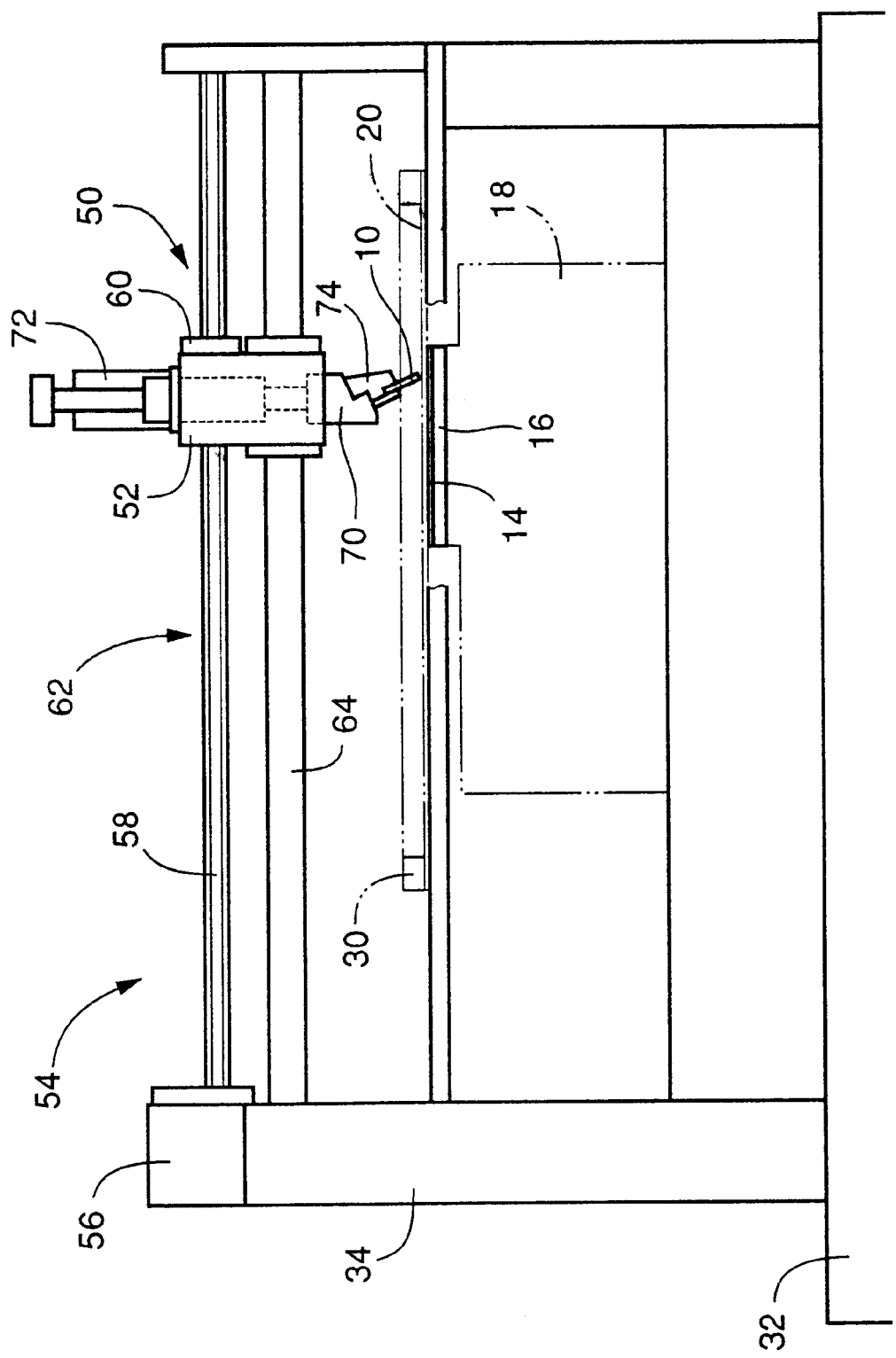
FIG. 1 is a schematic front elevation view of a screen printing machine including a squeegee to which the present invention is applied, and carrying out a screen printing method to which the present invention is also applied.
Figure 3:
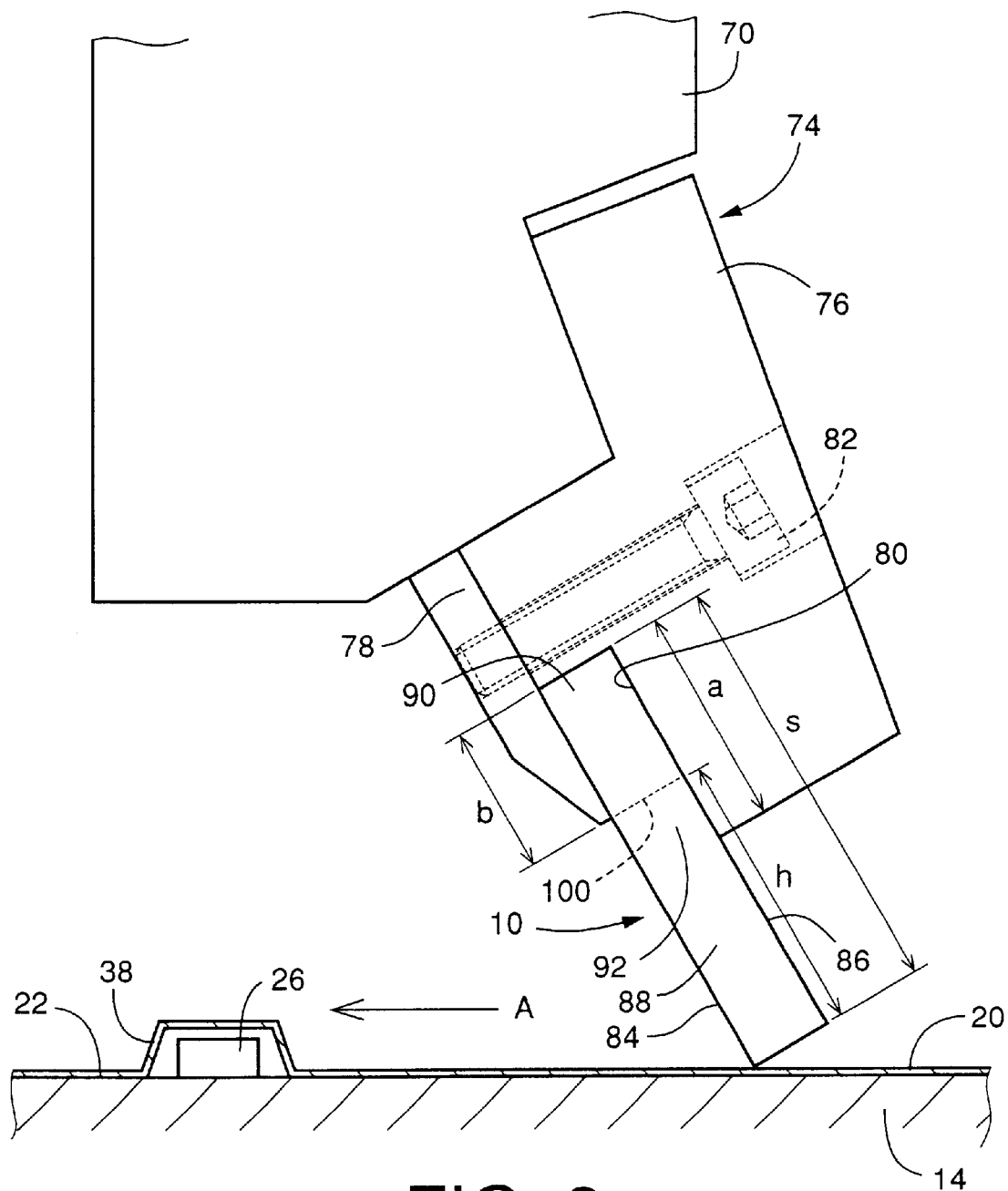
FIG. 3 is a partly cross-sectioned, enlarged elevation view of the squeegee of FIG. 1 held by a squeegee holder of the screen printing machine of FIG. 1.

As shown in FIG. 1, the screen 20 is fixed to a screen frame 30, which in turn is positioned relative to a main frame 34 provided on a bed 32 of the screen printing machine, and is attached to the same 34 such that the screen frame 30 is detachable from the same 34 while taking a horizontal posture. As shown in FIG. 2, the screen 20 has a plurality of print holes 36 corresponding to a plurality of print spots predetermined on the print surface 22 of the circuit board 14 to which the creamed solder is applied by the printing machine. The screen 20 is placed on the print surface 22 of the circuit board 14 on which the electric component 26 has been mounted. To this end, the screen 20 has an embossed portion 38 capable of accommodating the electric component 26, as shown in FIGS. 2 and 3. The screen 20 has two print holes 36 in the vicinity of, and on both lateral sides of, the embossed portion 38 in a widthwise direction of the screen 20 that is perpendicular to a print direction, A (FIG. 3), in which the squeegee 10 is moved relative to the screen 10 to force the creamed solder onto the print surface 22 of the circuit board 14 through the print holes 36 of the screen 20.

The squeegee 10 is moved relative to the screen 20 and the circuit board 14 in the print direction A by a squeegee moving device 50. The squeegee moving device 50 includes a movable member 52 and a movable-member moving device 54. The movable-member moving device 54 includes a servomotor 56 as a sort of electric motor as a drive source, and a motion converting device 62 which includes a feed screw 58 and a nut 60 and converts the rotation of the servomotor 56 into a linear movement of the movable member 52. Thus, the movable member 52 is moved by the moving device 54, while being guided by a guide rod 64.

The movable member 52 supports an elevator member 70 such that the elevator member 70 can be elevated and lowered, and an elevating and lowering device 72 which elevates and lowers the elevator member 70 relative to the movable member 52. A squeegee holder 74 which holds the squeegee 10 is detachably attached to the elevator member 70. When the elevator member 70 is elevated and lowered, the squeegee 10 is contacted with, and separated from, the screen 20. Thus, the elevator member 70 and the elevating and lowering device 72 provide a squeegee contacting and separating device which moves the squeegee 10 relative to the screen 20 so that the squeegee 10 is contacted with, and separated from, the screen 20. As described above, the squeegee 10 is moved on the screen 20 when the movable member 52 is moved by the movable-member moving device 54. Thus, the squeegee moving device 50 provides a moving device which moves at least one of the squeegee 10 and the screen 20 relative to the other of the squeegee 10 and the screen 20 in the print direction A parallel to the plane of the screen 20. The widthwise direction of the screen 20 is perpendicular to the print direction A and parallel to the plane of the screen 20.

As shown in FIG. 3, the squeegee holder 74 includes a base member 76 and a hold-down member 78 each of which has an elongate shape extending in the widthwise direction of the screen 20. The base member 76 is fixed to the elevator member 70, such that the lengthwise direction of the base member 76 is perpendicular to the print direction A of the squeegee 10 (or the movable member 52) and parallel to the plane of the screen. It can be said that the elevator member 70 also functions as a base member of a squeegee holding device and that the squeegee holding device includes, in addition to the elevator member 70 as the base member, the squeegee holder 74. The elongate base member 76 has an elongate recess 80 extending in the lengthwise direction thereof. The squeegee 10 that also has an elongate shape fits in the elongate recess 80 such that the lengthwise direction of the squeegee 10 is parallel to that of the base member 76. With the hold-down member 78 holding down the squeegee 10 against the base member 76, a plurality of bolts 82 as a sort of fixing means are fastened to fix the hold-down member 78 to the base member 76. Consequently the squeegee 10 is sandwiched between the base member 76 and the hold-down member 78, such that the lengthwise direction of the squeegee 10 is perpendicular to the print direction A and parallel to the plane of the screen 20, and such that the squeegee 10 projects downward from the squeegee holder 74. An upper end portion of the squeegee 10 that is held by the squeegee holder 74 will be referred to as the base end portion of the squeegee 10, and a lower end portion of the squeegee 10 for contact with the screen 20 will be referred to as the free end portion of the squeegee 10. The lengthwise direction of the squeegee 10 is parallel to the widthwise direction of the screen 20. The position where the squeegee 10 is held by the squeegee holder 74 in the widthwise direction of the screen 20 can be changed or adjusted by unscrewing the bolts 82, unfastening the squeegee 10 between the base member 76 and the hold-down member 78, and moving the squeegee 10 relative to the base member 76 and the hold-down member 78 in the widthwise direction of the screen 20.

The elongate recess 80 of the base member 76 has a dimension, a (shown in FIG. 3), equal to one second of a dimension, s, of the squeegee 10 between a free end thereof and a base end thereof, that is, a=s/2. A dimension, b, of a portion of the hold-down member 78 that cooperates with the base member 76 to hold the squeegee 10 is equal to one third of the dimension s, that is, b=s/3. Therefore, in the state in which the squeegee 10 is held by the squeegee holder 74, that is, is sandwiched by the base member 76 and the hold-down member 78, the hold-down member 78 binds the base end portion of the squeegee 10 that corresponds to one third of a front surface 84 of the squeegee 10, that is, a downstream-side surface 84 of the same 10 as viewed in the print direction A, and the base member 76 binds an upper half portion of the squeegee 10 that corresponds to one second of a rear surface 86 of the squeegee 10, that is, an upstream-side surface 86 of the same 10 as viewed in the print direction A. Thus, a lower half portion of the squeegee 10 is freely flexible relative to the squeegee holder 74. The lower half portion of the squeegee 10 that is not bound by the base member 76 or the hold-down member 78 provides a freely flexible portion 88; the base end portion (i.e., upper, one-third portion) of the squeegee 10 that is completely held by the squeegee holder 74 provides a non-flexible portion 90 that is not flexible relative to the squeegee holder 74; and an intermediate portion of the squeegee 10 between the freely flexible portion 88 and the non-flexible portion 90 provides a semi-flexible portion 92 that is bound by the base member 76 on the side of the rear surface 86 but is not bound by the hold-down member 78 on the side of the front surface 84. The semi-flexible portion 92 is less flexible than the freely flexible portion 88 but is more or less flexible as compared with the non-flexible portion 90. The dimension s/2 of the freely flexible portion 88 is so predetermined, in consideration of the material and thickness of the squeegee 10, as to be able to force an appropriate amount of the creamed solder into each of the print holes 36 of the screen 20.

The squeegee holder 74 is supported by the elevator member 70, in such a manner that the squeegee 10 held by the holder 74 is inclined such that the free end of the squeegee 10 is located on an upstream side of the base end thereof as viewed in the print direction A. In the present embodiment, the angle of inclination of the squeegee 10 relative to a plane perpendicular to the plane of the screen 20 and parallel to the widthwise direction of the same 20 is 30 degrees.

Figure 4A:
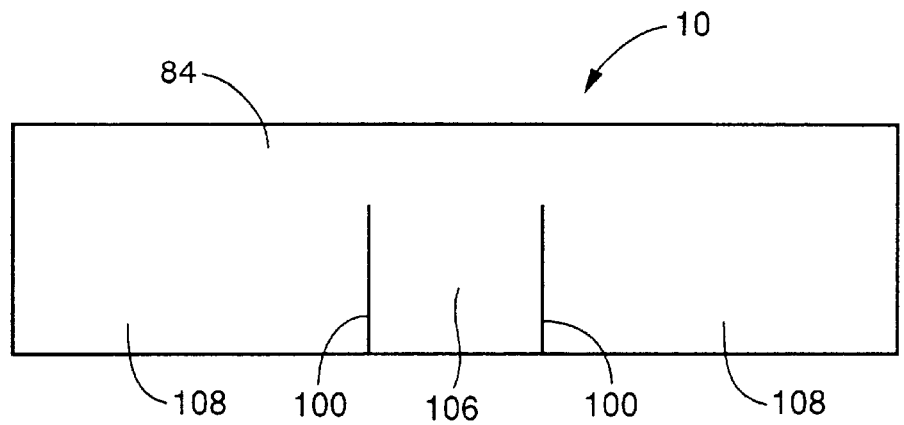
FIG. 4A is a front elevation view of the squeegee of FIG. 1.
Figure 4B:
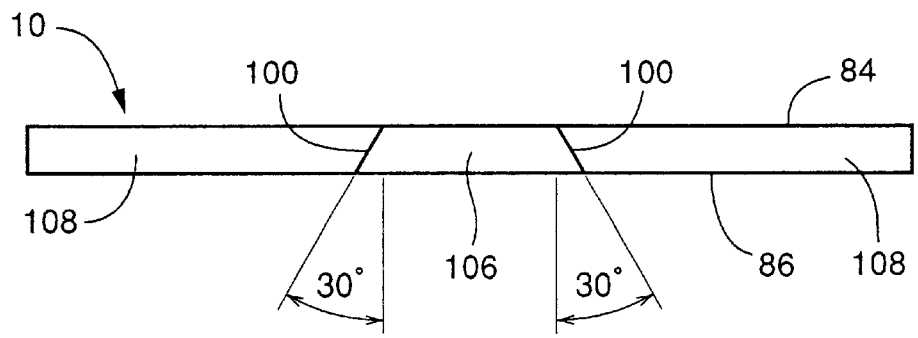
FIG. 4B is a bottom view of the squeegee of FIG.
Figure 4C:
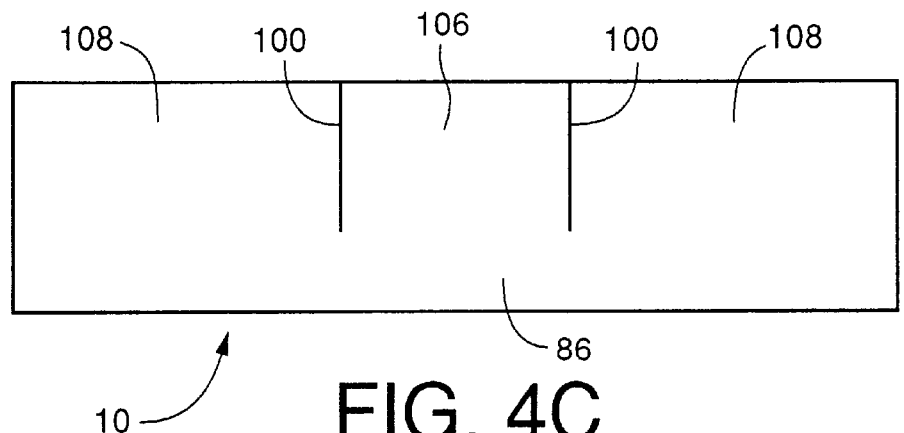
FIG. 4C is an inverted, rear elevation view of the squeegee of FIG. 1.

In the present embodiment, the squeegee 10 is formed of rubber. As shown in FIGS. 4A, 4B, and 4C, the squeegee 10 has two cuts or separations 100 on both sides of a portion of the squeegee 10, respectively, that corresponds to the embossed portion 38 of the screen 20. Each of the two separations 100 extends from the free end, i.e., contact edge of the squeegee 10 toward the base end portion of the same 10, in a direction perpendicular to the contact edge. In the present embodiment, each separation 100 has a length, h (FIG. 3), equal to two thirds of the dimension s of the squeegee 10, that is, h=2s/3. As shown in FIG. 4B, the two separations 100 are inclined such that the distance between the two separations 100 increases in a direction from the front surface 84 toward the rear surface 86. Thus, as shown in FIGS. 4A and 4C, the distance between the two separations 100 on the rear surface 86 is greater than that on the front surface 84. In the present embodiment, the absolute value of the degree of inclination of each of the two separations 100 relative to a plane perpendicular to the contact edge (i.e., free end) of the squeegee 10 and the front and rear surfaces 84, 86 is 30 degrees. On the front surface 84 of the squeegee 10, the two separations 100 are distant by 1 mm from opposite ends of the embossed portion 38 of the screen 20, respectively, in the widthwise direction of the screen 20. Each separation 100 has substantially no width. Since the squeegee 10 has the two separations 100, a portion of the squeegee 10 between the two separations 100 is flexible independent of the remaining portions of the squeegee 10. Hereinafter, that portion of the squeegee 10 will be referred to as the climb-over portion 106, and the remaining portions of the same 10 will be referred to as the non-climb-over portions 108. The present squeegee 10 is an exclusively-used squeegee which is exclusively used with the specific screen 20 having its specific embossed portion 38, for printing the creamed solder on the specific circuit board 14 having its specific projection (i.e., electric component 26).

As described above, the base end portion (i.e, upper, one-third portion) of the squeegee 10 provides the non-flexible portion 90, and the lower half portion (including the contact edge) of the squeegee 10 provides the freely flexible portion 88. Thus, each of the separations 100 has the length h which is equal to two thirds of the dimension s of the squeegee 10 (h=2s/3) and accordingly is greater than the dimension, s/2, of the freely flexible portion 88 of the squeegee 10.

Next, there will be described the operation of the screen printing machine constructed as described above. When the creamed solder is printed on the printed circuit board 14, the print surface 22 of the circuit board 14 is contacted with the screen 20, so that the screen 20 is superposed or placed on the circuit board 14. In this state, the squeegee 10 is moved on the screen 20 so as to squeeze the creamed solder on the screen 20 and force the solder into the print holes 36 of the screen 20. Consequently the creamed solder is printed on the print spots on the circuit board 14. The squeegee 10 is moved on the screen 20 while being pressed against the screen 20 and being elastically deformed, i.e., flexed.

Figure 5:
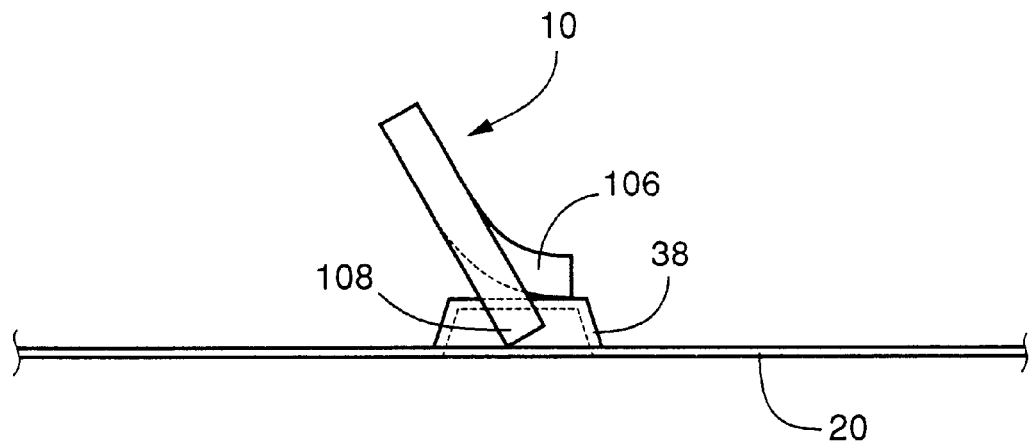
FIG. 5 is a partly cross-sectioned, elevation view of the squeegee of FIG. 1 that is climbing over an embossed portion of the screen, for printing the creamed solder on the circuit board.
Figure 6:
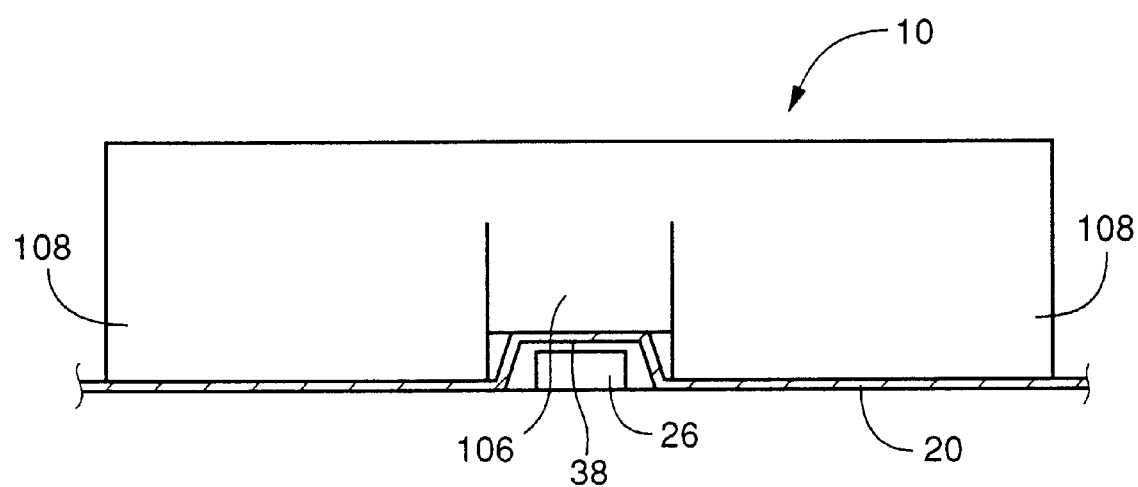
FIG. 6 is a partly cross-sectioned, elevation view of the squeegee of FIG. 1 that is climbing over the embossed portion of the screen.
Figure 7:
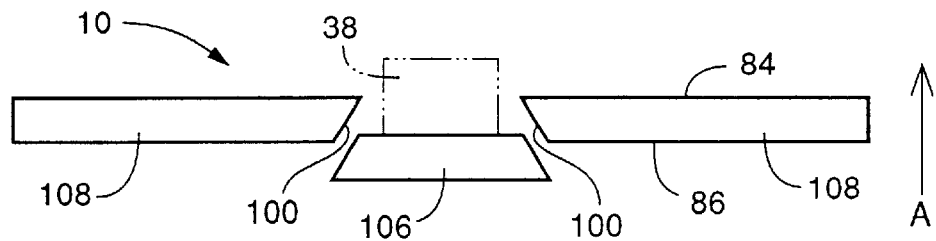
FIG. 7 is a bottom view of the squeegee of FIG. 1 that is climbing over the embossed portion of the screen.

When the squeegee 10 is moved on a portion of the screen 20 that is free of the embossed portion 38, the climb-over portion 106 and the non-climb-over portions 108 are moved as a unit without being separated from each other, for forcing the creamed solder into the print holes 36 of the screen 20. When the squeegee 10 reaches the embossed portion 38 of the screen 20, only the climb-over portion 106 of the squeegee 10 is flexed by the embossed portion 38, independent of the non-climb-over portions 108, as shown in FIGS. 5, 6, and 7. Thus, the climb-over portion 106 climbs over the embossed portion 38. Since the two non-climb-over portions 108 are separated from the climb-over portion 106 by the two separations 100, the non-climb-over portions 108 are not flexed with the climb-over portion 106, and are kept in contact with portions of the screen 20 that are free of the embossed portion 38, so that if those portions of the screen 20 have one or more print holes 36, the non-climb-over portions 108 force the creamed solder into the one or more print holes 36. Since the two separations 100 are inclined and accordingly substantially no friction occurs between each of opposite separation-defining surfaces of the climb-over portion 106 and a corresponding one of respective separation-defining surfaces of the two non-climb-over portions 108, the climb-over portion 106 is smoothly separated from the non-climb-over portions 108. That is, when the climb-over portion 106 is elastically deformed, the portion 106 does not pull the non-climb-over portions 108. Thus, the non-climb-over portions 108 are stably kept in contact with the screen 20. After the climb-over portion 106 has climbed over the embossed portion 38 of the screen 20, the portion 106 is elastically restored to its initial shape or position in which the portion 106 is flush with the non-climb-over portions 108, and is further moved smoothly on the screen 20.

The squeegee 10 includes the semi-flexible portion 92 between the freely flexible portion 88 and the non-flexible portion 90. When the squeegee 10 is pressed and flexed on the screen 20, the semi-flexible portion 92 is more or less flexed since it is not so strongly bound by the squeegee holder 74 as the non-flexible portion 90. In addition, the semi-flexible portion 92 is more or less flexed when the climb-over portion 106 climbs over the embossed portion 38 of the screen 20.

As described above, the position where the squeegee 10 is held by the squeegee holder 74 as viewed in the widthwise direction of the screen 20 can be changed or adjusted. Therefore, if there is a positional error between the climb-over portion 106 and the embossed portion 38, as viewed in the widthwise direction of the screen 20, a worker can change the position where the squeegee 10 is held by the holder 74, so that the two separations 100 are positioned on both lateral sides of the embossed portion 38 as viewed in the widthwise direction of the screen 20, and so that the climb-over portion 106 can climb over the embossed portion 38 and the non-climb-over portions 108 can continue moving on the screen 20 without being interfered with by the embossed portion 38.

Figure 8A:
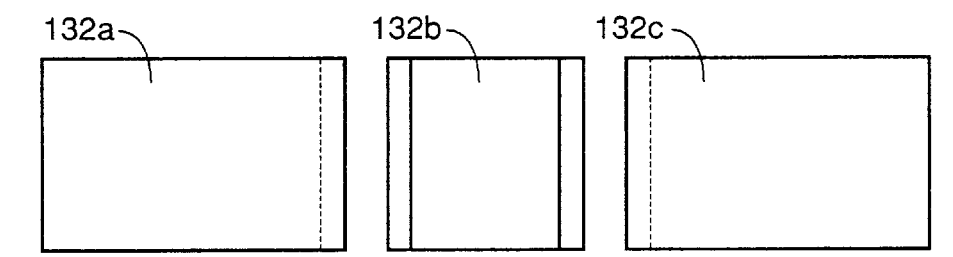
FIG. 8A is a front elevation view of another squeegee including a plurality of separate members, as a second embodiment of the present invention.
Figure 8B:
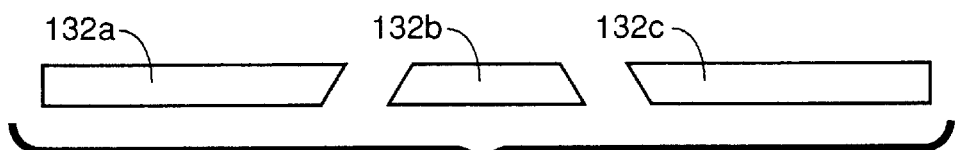
FIG. 8B is a bottom view of the squeegee of FIG. 8A.
Figure 8C:
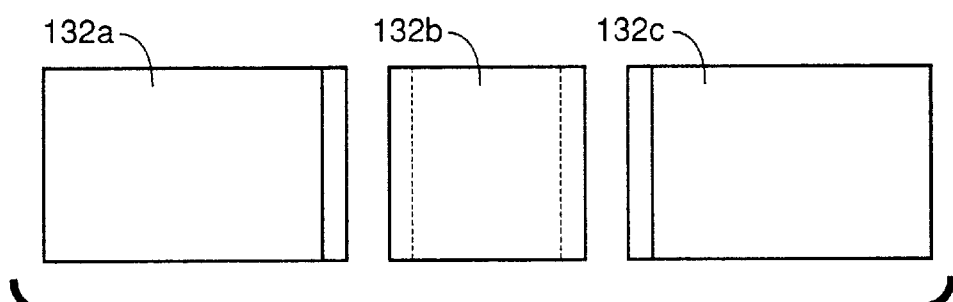
FIG. 8C is an inverted, rear elevation view of the squeegee of FIG. 8A.

The cuts or separations 100 formed in the above-described squeegee 10 have a length equal to two thirds of the dimension s of the squeegee 10 between the free end thereof and the base end thereof, and the climb-over portion 106 and the non-climb-over portions 108 are continuous with each other via the non-flexible portion 90. However, the squeegee 10 may be replaced with a squeegee including two or more separate flexible members which are arranged adjacent to each other in an array and whose respective base end portions are held by a holding member. For example, FIGS. 8A, 8B, and 8C shows a squeegee 130 including three generally rectangular, flat, separate flexible members 132a, 132b, 132c and having a dimension, s (shown in FIG. 9), between a free end thereof and a base end thereof. Thus, the three separate members 132a, 132b, 132c have the same dimension s. Each of the three separate members 132a, 132b, 132c is formed of an elastically deformable material, such as rubber.

Figure 9:
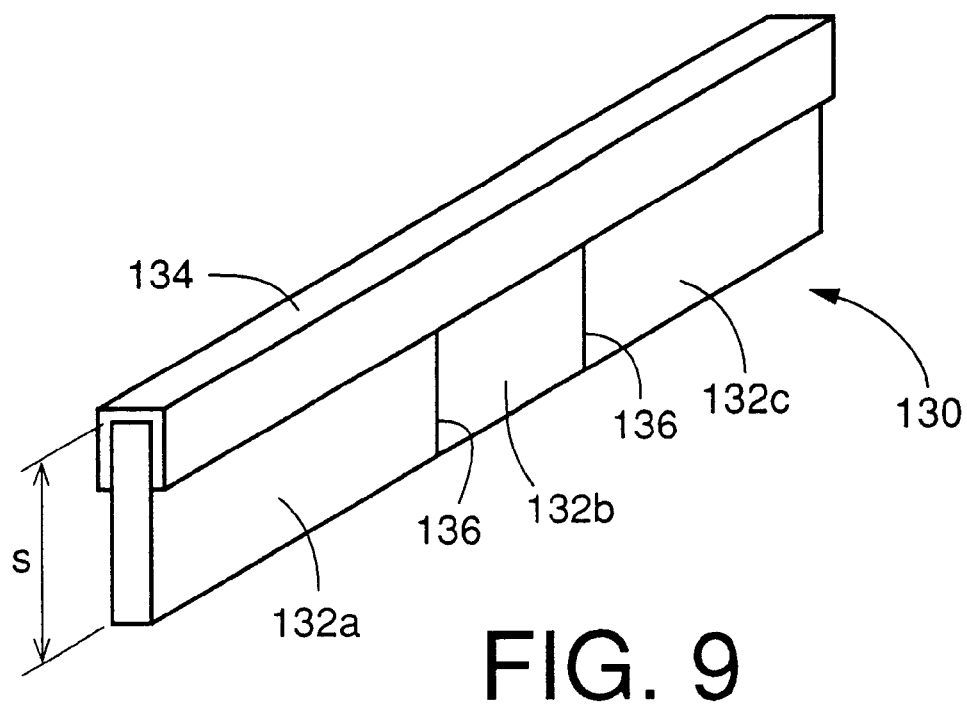
FIG. 9 is a perspective view of the separate members of FIG. 8A held by a clip of the squeegee.

The three separate members 132a, 132b, 132c are held by a clip 134 as the holding member. The three separate members 132a, 132b, 132c and the clip 134 cooperate with each other to provide the squeegee 130. As shown in FIG. 9, the clip 134 has a generally inverted-U-shaped cross section, and holds respective upper, one-third portions of the three separate members 132a, 132b, 132c such that the three members 132a, 132b, 132c are arranged in an array in the widthwise direction of the screen 20. The two separate members 132a, 132b cooperate with each other to define a first gap or separation 136, and the two separate members 132b, 132c cooperate with each other to define a second gap or separation 136. Thus, the squeegee 130 has the two separations 136, and the two separations 136 are inclined relative to a plane perpendicular to a front and a rear flat surface 138, 140 of the squeegee 130, such that the distance between the two separations 136 increases in a direction from the front surface 138 toward the rear surface 140. In the present embodiment, the absolute value of the angle of inclination of each of the two separations 136 relative to the above plane is 30 degrees. Each of the separations 136 has substantially no width.

The three separate members 132a, 132b, 132c are so formed as to have respective shapes and respective dimensions which assure that the separate members 132a, 132b, 132c define the two inclined separations 136 and, on the front surface 138 of the squeegee 130, the two separations 136 are distant by 1 mm from opposite ends of the embossed portion 38 of the screen 20, respectively. The middle separate member 132b provides a climb-over portion of the squeegee 130 that climbs over the embossed portion 38 of the screen 20, and the other separate members 132a, 132c provide non-climb-over portions of the squeegee 130.

Figure 10:
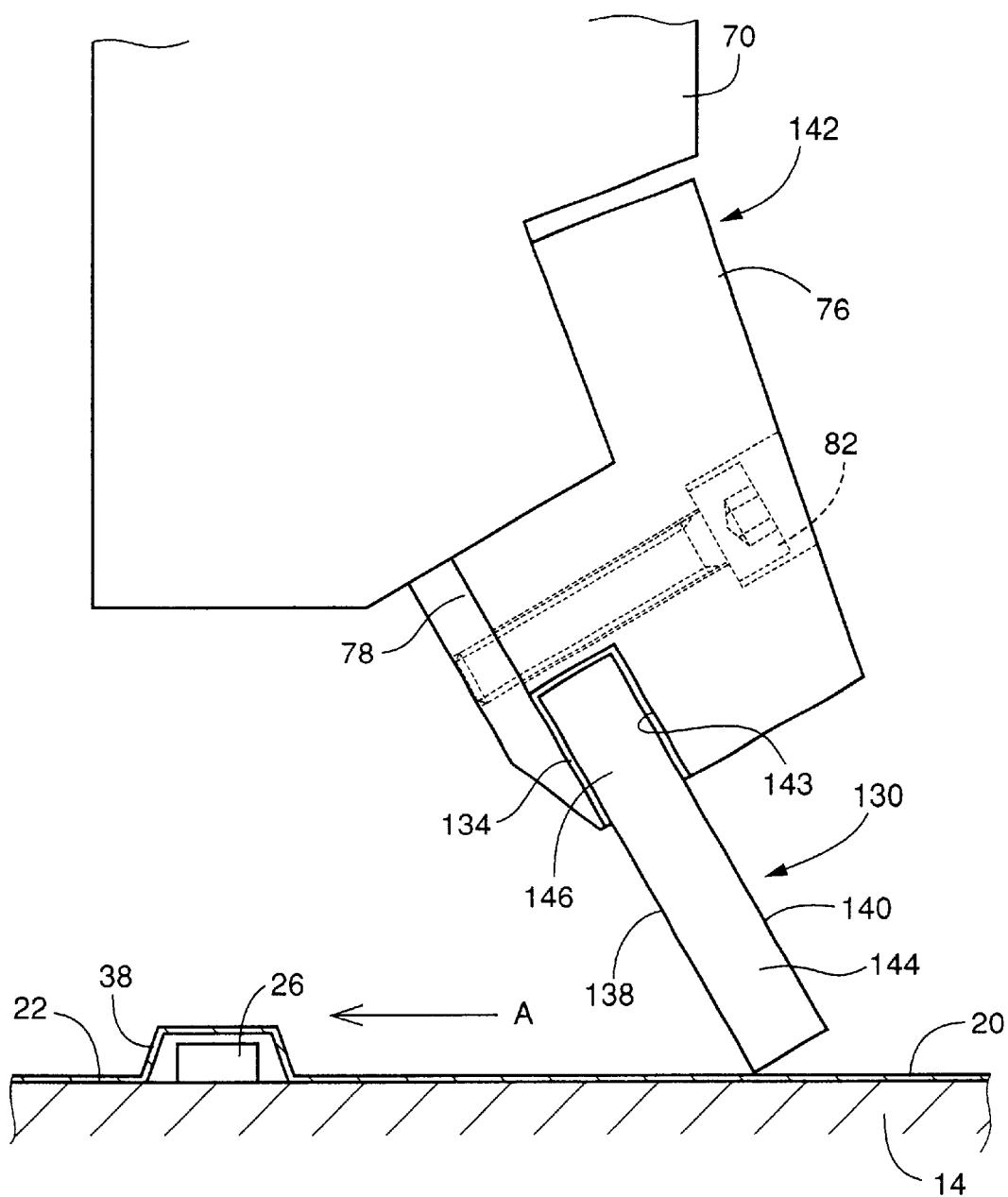
FIG. 10 is a partly cross-sectioned, elevation view of the squeegee of FIG. 9 and a squeegee holder of another screen printing machine.

As shown in FIG. 10, the squeegee 130 is held by a squeegee holder 142 of a screen printing machine. The squeegee holder 142 has a construction similar to that of the squeegee holder 74 of the screen printing machine shown in FIG. 3. The same reference numerals as used for the holder 74 are used to designate the corresponding elements or parts of the holder 142, and the description thereof is omitted. The squeegee holder 142 holds the clip 134. More specifically described, the clip 134 holding the three separate members 132a, 132b, 132c is fitted in an elongate recess 143 formed in the base member 76 and is sandwiched by the base member 76 and the hold-down member 78. Thus, the squeegee 130 is held by the squeegee holder 142. A lower, two-third portion of the squeegee 130 that projects from the clip 134 and includes a free end (i.e., a contact edge) of the squeegee 130 provides a freely flexible portion 144 which is freely flexible relative to the holder 142; and an upper, one-third portion of the squeegee 130 that is held by the clip 134 and includes a base end of the squeegee 130 provides a non-flexible portion 146 which is not flexible relative to the holder 142.

Like the first squeegee 10 shown in FIG. 3, the second squeegee 130 shown in FIG. 10 is moved on the screen 20 while forcing the creamed solder into the print holes 36 of the screen 20 and thereby printing the solder on the printed circuit board 14. When the squeegee 130 reaches the embossed portion 38 of the screen 20, the middle separate member 132b is flexed independent of the other separate members 132a, 132c, so as to climb over the embossed portion 38, and the other members 132a, 132c is kept in contact with the screen 20 so as to force the creamed solder into the print holes 36, if any, and thereby print the solder on the circuit board 14.

Figure 11:
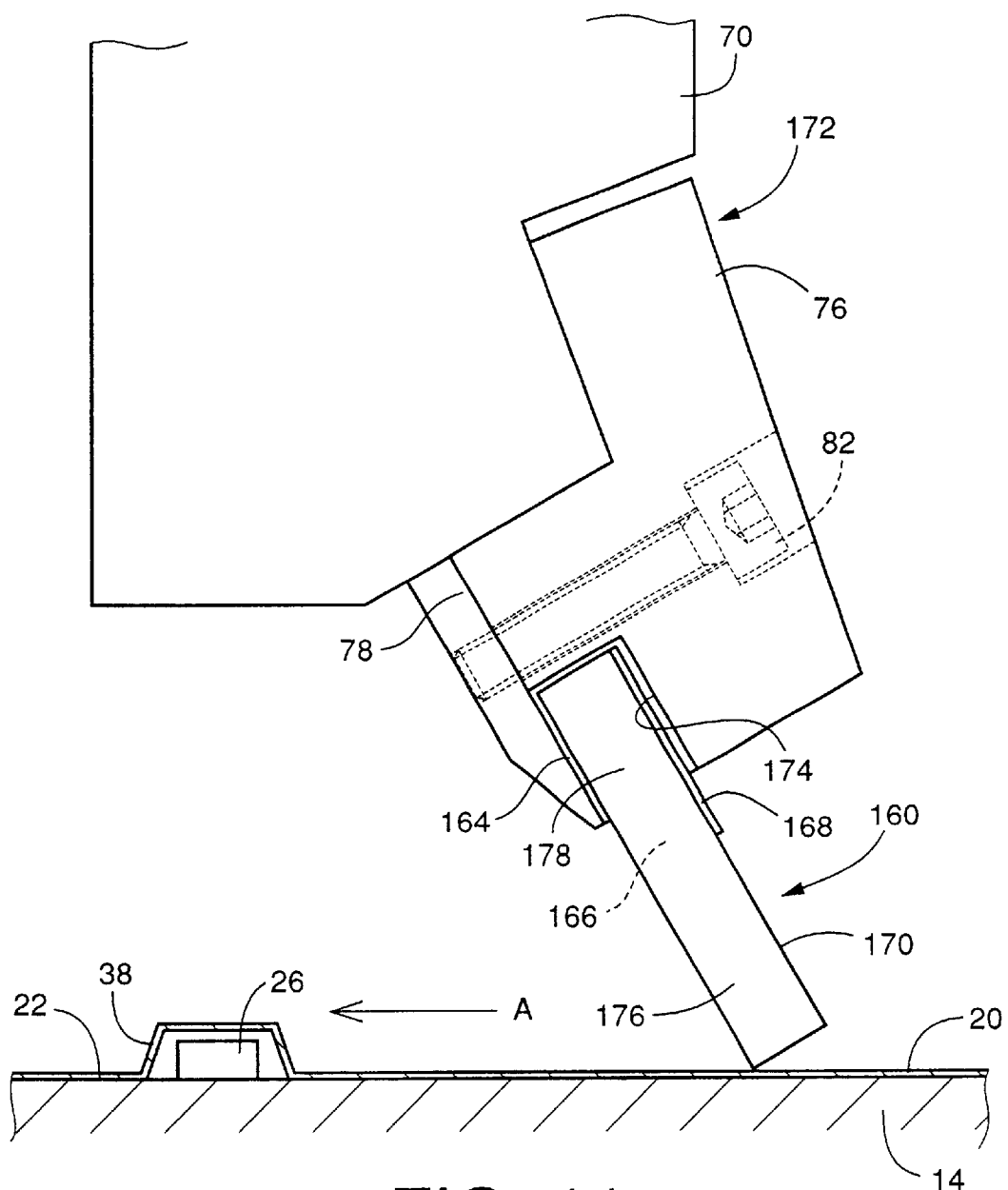
FIG. 11 is a partly cross-sectioned, enlarged elevation view of another squeegee and a squeegee holder of another screen printing machine as a third embodiment of the present invention.

In the first and second squeegees 10, 130 shown in FIGS. 1 to 10, the separations 100, 136 have a length greater than the dimension of the freely flexible portion 88, 144 and, when the squeegee 10, 130 climbs over the embossed portion 38 of the screen 20, the entirety of a portion of the squeegee 10, 130 that is provided between the two separations 100, 136 and that projects from the squeegee holder 74, 142 is flexible independent of the remaining portions of the squeegee 10, 130. However, it is not essentially required that the entirety of that portion of the squeegee 10, 130 be flexible. For example, FIG. 11 shows a squeegee 160 including three separate members which are arranged, like the three separate members 132a, 132b, 132c of the squeegee 130, in an array without any substantial space being left between each pair of adjacent separate members. A clip 164 as a holding member holds respective base end portions of the three separate members. The squeegee 160 has two gaps or separations 166 which are inclined like the gaps or separations 136 of the squeegee 130.

The three separate members are held by the clip 164 in a state in which the three members are supported by a thin elongate plate member 168. The plate member 168 has a dimension equal to one second of the dimension s of each of the three separate members. The plate member 168 is held in contact with a rear surface of the squeegee 160 by the clip 164, in a state in which the plate member 168 bridges over the three separate members. The clip 164 which holds an upper, one-third portion of the squeegee 160, is fitted in an elongate recess 174 of a base member 76 of a squeegee holder 172, and is held by the base member 76 and a hold-down member 78 of the squeegee holder 172 in a state in which the clip 164 is sandwiched by the two members 76, 78.

The plate member 168 is thin and, when the squeegee 160 is moved on the screen 20, is some or less flexed with the squeegee 160. The entirety of a portion of the squeegee 160 that projects from the clip 164 provides a flexible portion 176; and the upper, one-third portion of the squeegee 160 held by the clip 164 provides a non-flexible portion 178. That is, the two-third portion of the squeegee 160 projects from the squeegee holder 172, and the separations 166 extend from the contact edge of the squeegee 160 to the base end of the same 160. However, the rear surface of a portion of the flexible portion 176 that is around the squeegee holder 172 is supported by the plate member 168. Therefore, that portion is rather near to a state without any separations 166, and accordingly is rather difficult to be flexed. Thus, owing to the plate member 168, the squeegee 160 is pressed against the screen 20 with an appropriate force. When the middle one of the three separate members climbs over the embossed portion 38 of the screen 20, a portion of the middle separate member that is not supported by the plate member 168 is flexible independent of the other two separate members. The squeegee 160 is provided by the three separate members and the two separations 166 have a length equal to the width of the squeegee 160 as measured in a direction perpendicular to the contact edge thereof. However, only a portion of each separation 166 that is free of the plate member 168 can function as a separation. Thus, it can be said that the length of each separation 166 of the squeegee 160 is longer than half the width of the flexible portion 176 and is shorter than the entire width of the same 176. Owing to this feature, the middle separate member quickly returns, after climbing over the embossed portion 38, to its original shape or position in which the middle separate member is flush with the other separate members on both sides thereof.

Figure 12:
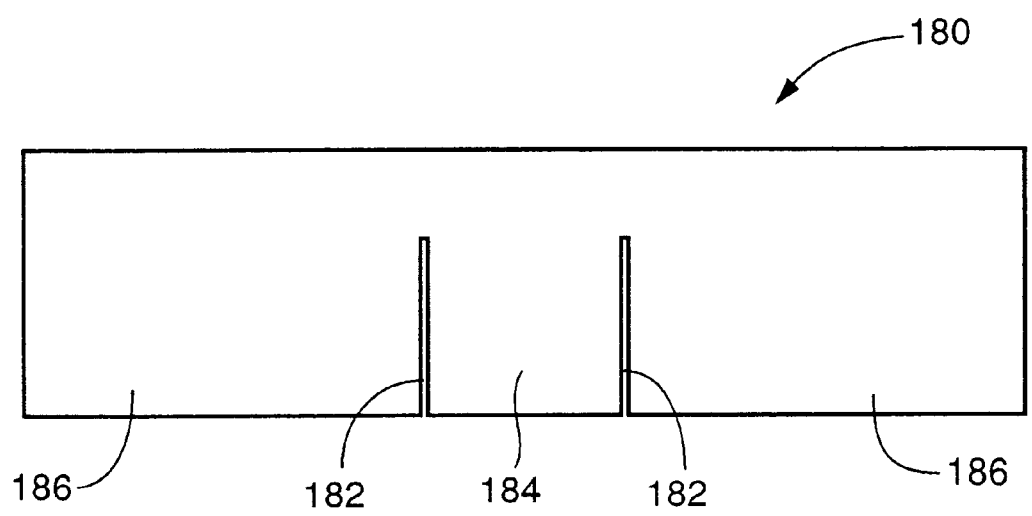
FIG. 12 is an elevation view of another squeegee as a fourth embodiment of the present invention.

In each of the illustrated embodiments, the separations 100, 136, 166 are inclined relative to a plane perpendicular to the front and rear surfaces of the squeegee 10, 130, 160, and have substantially no width. However, it is possible to employ a separation which is not inclined or has a substantial width. FIG. 12 shows an example 180 of a squeegee having separations each of which is not inclined and has a width.

The squeegee 180 has two separations 182 each of which extends in a direction from a lower, free end (i.e., contact edge) of the squeegee 180 toward an upper base end thereof, such that each separation 182 is perpendicular to the contact edge. Each separation 182 has a length equal to two thirds of a width of the squeegee 180 between the contact edge and base end thereof. The separations 182 are not inclined, but are parallel to a plane perpendicular to front and rear surfaces of the squeegee 180. Each separation 182 has a constant width equal to 0.05 mm, between the front and rear surfaces of the squeegee 180. The two separations 182 are distant by 1 mm from opposite ends of the embossed portion 38 of the screen 20 in the widthwise direction of the same 20. Like the squeegee 10, the squeegee 180 is held by a squeegee holder (not shown), and includes a freely flexible portion, a non-flexible portion, and a semi-flexible portion. The two separations 182 cooperate with each other to define a climb-over portion 184 which is flexible independent of non-climb-over portions 186 of the squeegee 180. Since each separation 182 is not inclined and has a substantial width, the climb-over portion 184 can climb over the embossed portion 38 while flexing without causing any friction with the non-climb-over portions 186 or dragging the same 186 backward. Thus, the non-climb-over portions 186 are kept in contact with a portion of the screen 20 that is free of the embossed portion 38.

Figure 13:
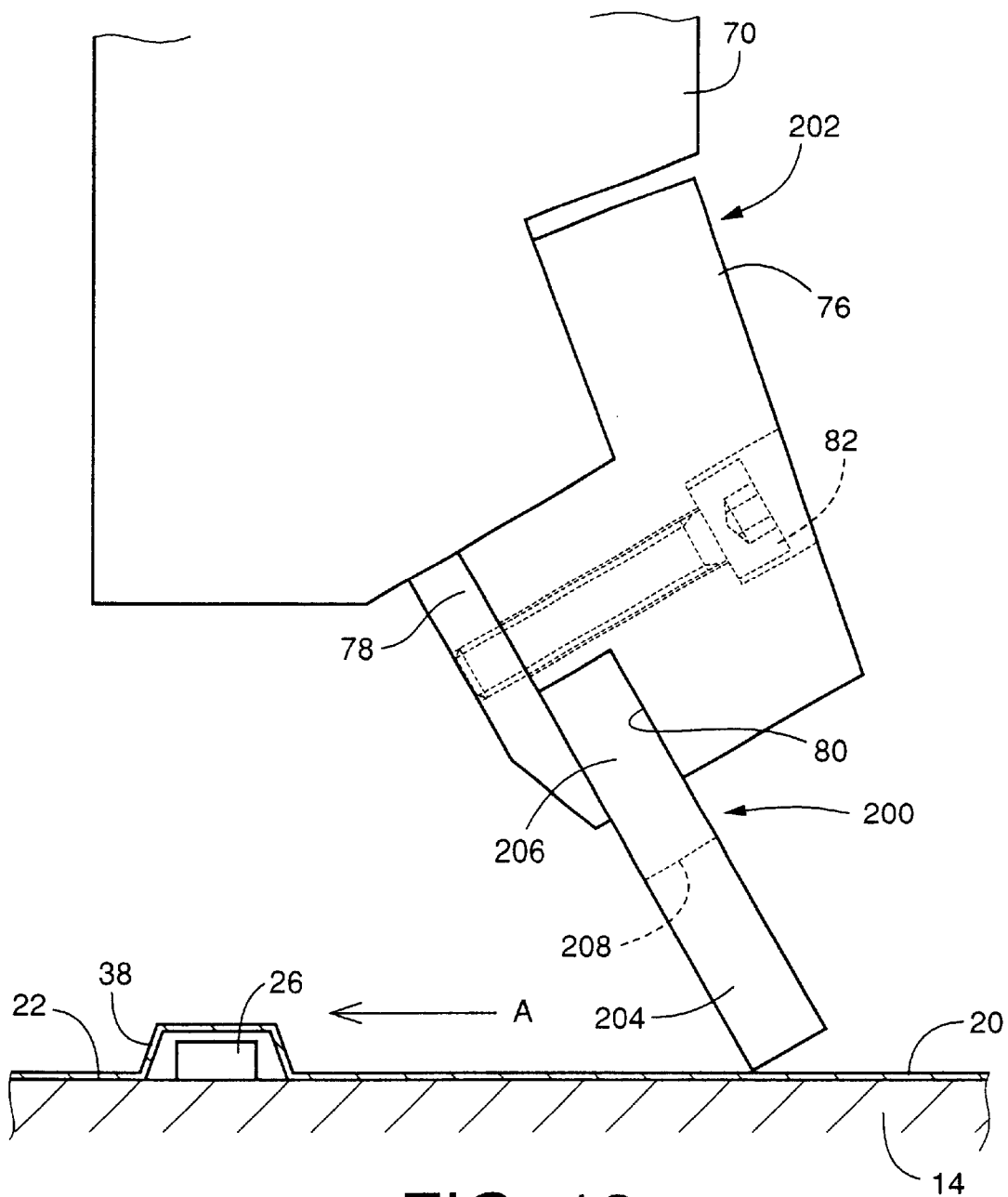
FIG. 13 is a partly cross-sectioned, enlarged elevation view of another squeegee and a squeegee holder of another screen printing machine as a fifth embodiment of the present invention.

According to the present invention, a squeegee may have a separation having a length shorter than a width of a freely flexible portion of the squeegee and is not shorter than half the width. For example, FIG. 13 shows a squeegee 200 whose upper, one-third portion is held by a squeegee holder 202 and whose remaining two-third portion provides a freely flexible portion 204. The upper, one-third portion of the squeegee 200 provides a non-flexible portion 206. The squeegee 200 has two separations 208. Each separation 208 has a length equal to half a width of the squeegee 200 and equal to three fourths of a width of the free flexible portion 204. Each separation 208 may be inclined relative to a plane perpendicular to front and rear surfaces of the squeegee 200, or may not be inclined relative to the plane, that is, may be parallel to the plane. The present squeegee 200 enjoys the same advantages as those of the squeegee 160 shown in FIG. 11.

In each of the illustrated embodiments the squeegee 10, 130, 160, 180, 200 is exclusively used with a specific sort of screen 20 corresponding to a specific sort of printed circuit board 14 as an object on which creamed solder is to be printed. However, the present invention may be applied to a squeegee which is widely used with a plurality of sorts of printed circuit boards, for printing creamed solder on each sort of circuit boards.

Figure 14:
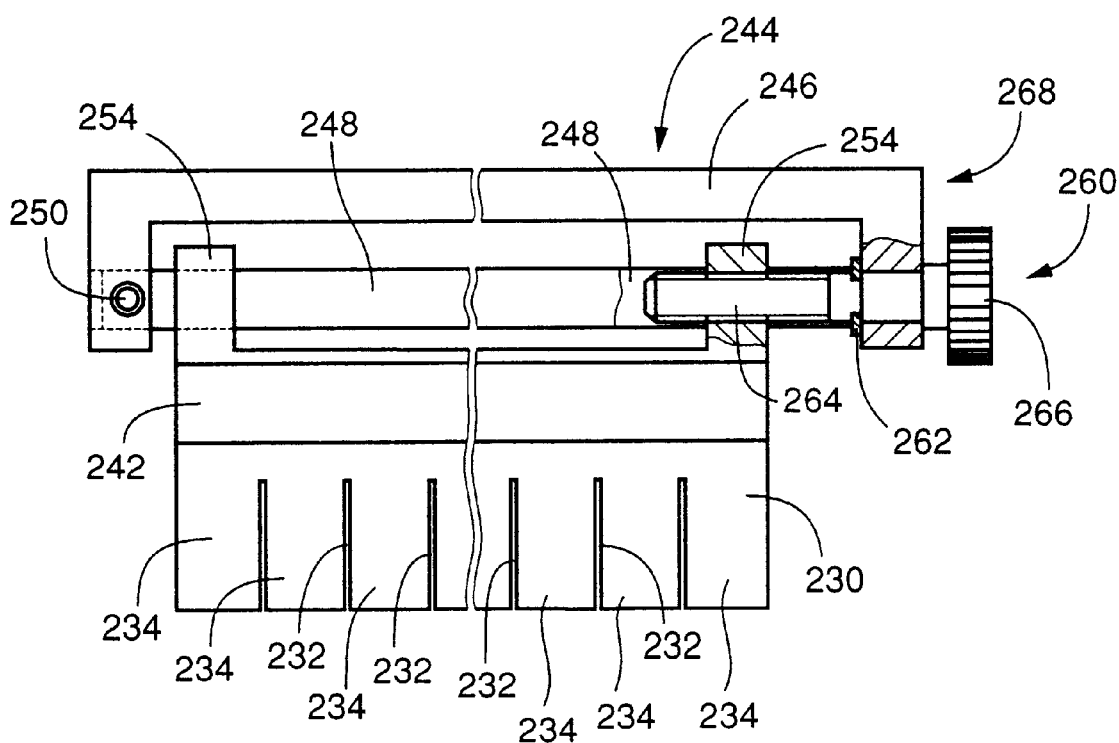
FIG. 14 is an elevation view of another squeegee, a squeegee holder, a squeegee guide, and a position adjusting device of another screen printing machine as a sixth embodiment of the present invention.
Figure 15:
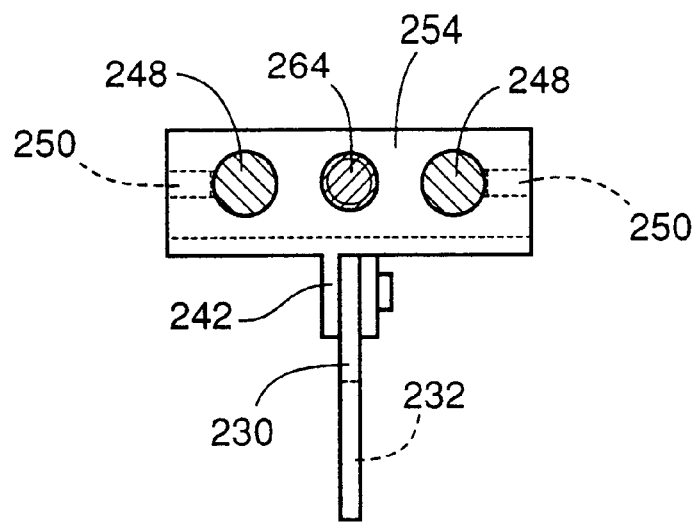
FIG. 15 is a partly cross-sectioned, elevation view of the squeegee holder, a guide rod, and a position-adjust screw of the screen printing machine of FIG. 14.
Figure 16:
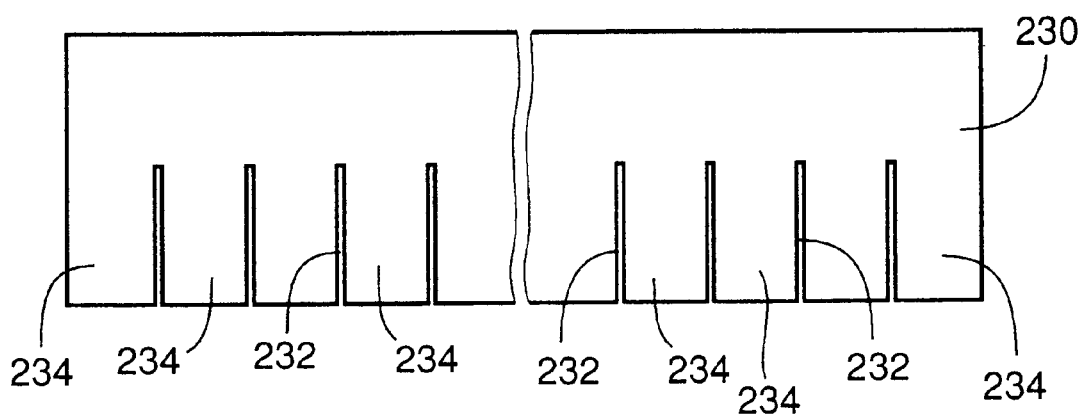
FIG. 16 is an elevation view of the squeegee of FIG. 14.

In addition, it is possible to employ a squeegee holder which is provided with a position adjusting device which adjusts the position of a squeegee relative to the squeegee holder in a lengthwise direction of the squeegee where the squeegee is held by the squeegee holder. FIGS. 14, 15, and 16 show a screen printing machine including a widely-used squeegee 230 and a squeegee holder 242 provided with a position adjusting device 268.

As shown in FIG. 16, the present squeegee 230 has a plurality of cuts or separations 232 at a regular interval of distance, i.e., at a predetermined pitch over an entire length of the squeegee 230. The pitch is predetermined based on the respective sizes of projections (e.g., electric components 26) present on a plurality of sorts of printed circuit boards 14. Each of the separations 232 has a length equal to half the width of the squeegee 230, and is not inclined relative to a plane perpendicular to major surfaces of the same 230, i.e., are parallel to the plane. Like the separations 182 of the squeegee 180 shown in FIG. 12, each of the separations 232 has a substantial width. Owing to the formation of the separations 232, the squeegee 230 has a plurality of independent flexible portions 234 whose total number is greater by one than that of the separations 232. In the case where only one or more, but not all, of the independent flexible portions 234 climbs or climb over one or more embossed portions 38 of the screen 20, the one or more independent flexible portions 234 functions or function as one or more climb-over portions of the squeegee 230, and the remaining independent flexible portion or portions 234 functions or function as one or more non-climb-over portions of the squeegee 230.

As shown in FIGS. 14 and 15, the squeegee 230 is held by a squeegee holder 242 which in turn is attached to an elevator member (not shown) via a main member 246 of a squeegee guide device 244. The squeegee guide device 244 includes, in addition to the main member 246, a pair of guide rods 248. Opposite end portions of each of the two guide rods 248 are fitted in the main member 246 and are fixed to the same 246 with respective set screws 250.

The squeegee holder 242 includes two guided portions 254 which are distant from each other in a direction parallel to the lengthwise direction of the squeegee 230 and which are fitted on the two guide rods 248 such that the holder 242 is movable relative to the rods 248. Thus, the squeegee 230 is movable in its lengthwise direction while being guided by the squeegee guide device 244 and being prevented from rotating relative to the elevator member (not shown).

One of the two guided portions 254 of the squeegee holder 242 has an internally threaded hole in which a position-adjust screw 260 is screwed. The adjust screw 260 is fitted in the main member 246 such that the screw 260 is rotatable, but not movable in its axial direction, relative to the main member 246. The adjust screw 260 extends parallel to the guide rods 248, and is prevented by a stop ring 262 from coming off the main member 246. The adjust screw 260 includes an externally threaded portion 264 which is screwed in the internally threaded hole of the one guided portion 254 of the squeegee holder 242. When a worker turns a knob 266 of the adjust screw 260 and thereby rotates the screw 260, the squeegee holder 242 is moved by being guided by the guide rods 248, so that the position of the squeegee 230 relative to the holder 242 in the lengthwise direction of the squeegee 230 can be adjusted. The adjust screw 260, a portion of the one guided portion 254 of the squeegee holder 242 that has the internally threaded hole, and a portion of the main member 246 that supports the adjust screw 260 such that the screw 260 is rotatable but immovable in its axial direction cooperate with one another to provide a position adjusting device 268. The main member 246 of the squeegee guide device 244 is held by the elevator member such that the main member 246 is attachable to, and detachable from, the elevator member and the squeegee 230 is inclined relative to a plane perpendicular to the screen 20. In the present embodiment, a squeegee holding device includes a main member which is integral with the elevator member (not shown) and to which the main member 246 of the squeegee guide device 244 is attached; the squeegee guide device 244; and the squeegee holder 242, and additionally the squeegee holding device includes the position adjusting device 268.

Before the creamed solder is printed on the circuit board 14, the position of the squeegee 230 relative to the squeegee holder 242 in the widthwise direction of the screen 20 is adjusted so that one or more climb-over portions 234 are accurately aligned with one or more embossed portions 38 of the screen 20, that is, each climb-over portion 234 can climb over a corresponding embossed portion 38. When the creamed solder is printed, the squeegee 230 is moved on the screen 20. When the squeegee 230 reaches one embossed portion 38, the corresponding climb-over portion 234 is flexed by the one embossed portion 38 so as to climb over the same 38. When the current sort of circuit boards 14 are changed to another sort of circuit boards 14, the current screen 20 is replaced with another screen 20 corresponding to the new sort of circuit boards 14. However, the squeegee 230 is not replaced, that is, is used with the new screen 20. The position of the squeegee 230 relative to the squeegee holder 242 in the widthwise direction of the new screen 20 may be adjusted, if necessary, so that one or more climb-over portions 234 corresponding to one or more embossed portions 38 of the new screen 20 can climb over the one or more embossed portions 38 and one or more non-climb-over portions 234 cannot interfere with any embossed portions 38.

In the first embodiment shown in FIG. 4b, each of the inclined separations 100 of the squeegee 10 does not have a substantial width. However, each inclined separation 100 may have a substantial width, e.g., resulting from the specific manner in which each separation 100 is formed in the squeegee 10. This also falls in the scope of the present invention.

In the fourth embodiment shown in FIG. 12, each of the separations 182 is not inclined but is parallel to the plane perpendicular to the front and rear surfaces of the squeegee 180, and has a substantial width. However, each separation 182 may have substantially no width.

In each of the first to fifth embodiments shown in FIGS. 1 to 13, each squeegee 10, 130, 160, 180, 200 is exclusively used for carrying out screen printing on a corresponding specific sort of printed circuit boards 14. For the purpose of easier illustration and description, it is assumed that each squeegee 10, 130, 160, 180, 200 has the single climb-over portion. However, in the case where a certain sort of printed circuit board has, on its print surface, a plurality of projections having different positions in the widthwise direction of the screen 20, the squeegee may have a plurality of climb-over portions. In the case where a squeegee has one or more separations each of which is shorter than the width of the squeegee between its contact edge and its base end, the one or more separations is or are formed in a number corresponding to the number of projection or projections on a printed circuit board, and at one or more positions corresponding to the position or positions of the projection or projections, so that one or more climb-over portions is or are provided corresponding to the one or more projections. Meanwhile, in the case where a squeegee is provided by a plurality of separate members, the number of the separate members is predetermined corresponding to the number of one or more projections on the circuit board, so that one or more climb-over portions is or are provided corresponding to the one or more projections.

In each of the illustrated embodiments, it is possible to employ an angle adjusting device which adjusts the angle of inclination of the squeegee 10, 130, 160, 180, 200, 230 relative to the screen 20. For example, the angle adjusting device may be one which adjusts the angle of inclination of the squeegee holder 74, 142, 172, 202, 242, relative to the main member of the squeegee holding device. Alternatively, the squeegee holding device may be one which includes the angle adjusting device and a support member which supports the angle adjusting device. In the latter case, the squeegee holder is attached to the angle adjusting device, so that the angle of the squeegee holder relative to the support member can be adjusted by the angle adjusting device. Otherwise, the angle adjusting device may be one which adjusts the angle of the squeegee holding device relative to a support member, such as the elevator member 70, thereby adjusting the angle of the squeegee 10, 130, 160, 180, 200, 230 relative to the screen 20.

In the second or third embodiment shown in FIG. 9 or 11 wherein the squeegee 130 or 160 is provided by the two or more separate members 132a, 132b, 132c, the separations 136 or 166 are inclined relative to the plane perpendicular to the front and rear surfaces of the squeegee 130 or 160. However, the separations 136 or 160 may not be inclined, i.e., may be parallel to the plane.

In the third embodiment shown in FIG. 11 wherein the squeegee 160 is supported by the support plate 168, the separations 166 are inclined relative to the plane perpendicular to the front and rear surfaces of the squeegee 160. However, the separations 160 may not be inclined, i.e., may be parallel to the plane.

It is to be understood that the present invention may be embodied with other changes, modifications, and improvements that may occur to a person skilled in the art without departing from the scope and spirit of the invention defined in the appended claims.

What is claimed is:

1. A squeegee for use in screen printing, comprising:
 a common base portion;
 a flexible portion; and
 one separation or two separations extending from a contact edge of the flexible portion for contact with a screen, toward the common base portion, thereby at least partly separating the flexible portion, so that the flexible portion includes a first portion between the one separation and a lateral edge of the flexible portion, or between the two separations, and a second portion different from the first portion, and so that the first portion and the second portion are flexible independent of each other, each of the first and second portions of the flexible portion being integral with the common base portion.

2. A squeegee according to claim 1, wherein the one separation or each of the two separations has a length not smaller than one second of a dimension of the flexible portion in a direction in which the one separation or said each of the two separations extends.

3. A squeegee according to claim 2, wherein the one separation or said each of the two separations has a length not smaller than the dimension of the flexible portion in said direction in which the one separation or said each of the two separations extends.

4. A squeegee according to claim 1, wherein the one separation or each of the two separations has a width of 0.05 mm to 0.4 mm.

5. A squeegee according to claim 1, having at least three separations each of which extends from the contact edge of the flexible portion toward the base portion of the squeegee, and which are provided at a regular interval of distance over a substantially entire length of the flexible portion in a direction parallel to the contact edge thereof.

6. A squeegee for use in screen printing, comprising:
a flexible portion; and
at least two separations extending from a contact edge of the flexible portion for contact with a screen, toward a base portion of the squeegee, thereby at least partly separating the flexible portion, so that the flexible portion includes a first portion between the two separations, and a second portion different from the first portion, and so that the first portion and the second portion are flexible independent of each other,
the two separations being inclined relative to a plane perpendicular to opposite surfaces of the flexible portion, such that a distance between the two inclined separations increases in a direction from a front one of the opposite surfaces toward the other, rear surface.

7. A squeegee according to claim 8, wherein an absolute value of an angle of inclination of each of the two separations relative to said plane falls in a range of from 10 degrees to 45 degrees.

8. A squeegee according to claim 6, wherein the flexible portion has a predetermined uniform thickness.

9. A method of printing a print material on a printed circuit board, by placing a screen having a plurality of print holes, on the circuit board, placing the print material on the screen, and moving at least one of a squeegee and the screen placed on the circuit board, relative to the other of the squeegee and the screen, in a first direction parallel to a plane of the screen, thereby forcing the print material through the print holes of the screen onto a plurality of print spots on a print surface of the circuit board, the circuit board having, on the print surface thereof, at least one projection, and at least one print spot in a vicinity of the at least one projection in a second direction substantially perpendicular to the first direction, the method comprising the steps of:
providing the screen having at least one embossed portion capable of accommodating the at least one projection, and at least one print hole in a vicinity of the at least one embossed portion in the second direction,
providing the squeegee having a common base portion and having, between one separation thereof and a lateral edge thereof, or between two separations thereof, at least one climb-over portion corresponding to the at least one embossed portion of the screen, the one separation or the two separations extending from a contact edge of the squeegee for contact with the screen, toward the common base portion of the squeegee, thereby at least partly separating the squeegee, and
forcing, with a different portion of the squeegee from the climb-over portion thereof, the print material through the print hole in the vicinity of the embossed portion of the screen onto the print spot in the vicinity of the projection on the print surface of the circuit board, while the climb-over portion of the squeegee climbs over the embossed portion of the screen, each of the climb-over portion and the different portion being integral with the common base portion.

10. A method according to claim 9, wherein the step of providing the squeegee comprises providing the squeegee having the one separation, or each of the two separations, at a distance of 0.5 mm to 4 mm from a corresponding one of opposite ends of the embossed portion of the screen in the second direction.

* * * * *